US009477277B2

United States Patent
Coq et al.

(10) Patent No.: US 9,477,277 B2
(45) Date of Patent: Oct. 25, 2016

(54) VARYING POWER LOAD CONDITIONS ON SYSTEMS UNDER TEST

(71) Applicant: GLOBALFOUNDRIES INC., Grand Cayman, KY (US)

(72) Inventors: Marc H. Coq, Hopewell Junction, NY (US); Anthony G. Gorey, Shkill, NY (US); Jason T. Hirst, Poughkeepsie, NY (US); Rohan A. Jones, Poughkeepsie, NY (US); Michel H. Joseph, Poughkeepsie, NY (US); Gerald G. Stanquist, Salt Point, NY (US); Brian W. Stocker, Port Ewen, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 714 days.

(21) Appl. No.: 13/919,247

(22) Filed: Jun. 17, 2013

(65) Prior Publication Data

US 2014/0372066 A1    Dec. 18, 2014

(51) Int. Cl.
*G01R 35/00* (2006.01)
*G06F 1/26* (2006.01)
*G01R 31/319* (2006.01)
*G01R 31/28* (2006.01)

(52) U.S. Cl.
CPC ............. *G06F 1/26* (2013.01); *G01R 31/2834* (2013.01); *G01R 31/319* (2013.01)

(58) Field of Classification Search
CPC .......... G01R 31/319; G01R 31/31718; G01R 31/2834

USPC .................................. 702/108, 109, 117–119
See application file for complete search history.

(56) References Cited

U.S. PATENT DOCUMENTS

| | | | |
|---|---|---|---|
| 6,356,057 B1 * | 3/2002 | Shilo | G01R 31/40 320/127 |
| 6,718,425 B1 | 4/2004 | Pajakowski et al. | |
| 7,577,727 B2 | 8/2009 | Kota et al. | |
| 7,899,610 B2 | 3/2011 | McClellan | |
| 8,040,266 B2 | 10/2011 | Thiagarajan et al. | |
| 2011/0022870 A1 | 1/2011 | McGrane et al. | |
| 2012/0166764 A1 | 6/2012 | Henry et al. | |

* cited by examiner

*Primary Examiner* — An Do
(74) *Attorney, Agent, or Firm* — Yuanmin Cai; Hoffman Warnick LLC (57) ABSTRACT

An apparatus includes a system test module that initiates a system power test for a computer system. The computer system includes one or more power supplies that provide power to system components. The system power test includes determining power system characteristics under various loading conditions. The apparatus includes a configure module that configures a system component during the system power test. The system component uses a higher amount of power after being configured than in a previous un-configured condition. The apparatus includes a de-configure module that de-configures the system component during the system power test. The system component uses a lower amount of power after being de-configured than in a previous configured condition. The apparatus includes a diagnostic module that measures power system performance of the computer system during varying loading conditions caused by configuring and de-configuring one or more system components by the configure module and the de-configure module.

20 Claims, 5 Drawing Sheets

VARYING POWER LOAD CONDITIONS ON SYSTEMS UNDER TEST

FIELD

The subject matter disclosed herein relates to computer power and more particularly relates to testing computer power systems while the computer system is operational.

BACKGROUND

Description of the Related Art

Computer systems include several sub-systems. One such sub-system is a power system. A power system of a computer system typically includes some type of power supply, one or more power buses, and a variety of system components that use power and receive the power from the power buses either directly or indirectly. The system components range from a core of a central processing unit ("CPU" or more simply "processor") to memory to computer buses. Power systems can become unstable in some conditions. In addition, power systems may not function as planned when connected in a final configuration.

In some cases, a power supply may be stable or may operate within acceptable limits when supplying one type of load, but connected to a different load the power supply may become unstable or may operate outside of specified ranges. Often power supplies are tested using resistive loads or other loads that simulate conditions of a computer system. Often power supplies are run in parallel and feedback loops may be designed to keep the power supplies sharing equally during parallel operation. However, when one or more power supplies are installed in a computer system, the loading on the power supplies may differ from bench testing or testing using simulated loading. Testing of the power supply with resistive or simulated loads may lead to a conclusion that when installed in the computer system that the power system of the computer system is stable, is connected properly, and will operate within specifications when in reality power system problems may exist in the final configuration as actually installed that were not previously detected or predicted.

BRIEF SUMMARY

An apparatus for power system testing is disclosed. A method and system also perform the functions of the method. The apparatus includes a system test module that initiates a system power test for a computer system. The computer system includes one or more power supplies that provide power to a plurality of system components. The system power test includes determining power system characteristics under various loading conditions. The apparatus includes a configure module that configures a system component of the plurality of system components during the system power test. The system component uses a higher amount of power after being configured than in a previous un-configured condition. The apparatus includes a de-configure module that de-configures the system component during the system power test. The system component uses a lower amount of power after being de-configured than in a previous configured condition. The apparatus includes a diagnostic module that measures power system performance of the computer system during varying loading conditions caused by configuring and de-configuring one or more system components by the configure module and the de-configure module.

In one embodiment, the configure module configures the system component and the de-configure module de-configures the system component using one or more system firmware commands while the computer system is operational. In another embodiment, configuring the system component changes the system component from a non-operational state to an operational state. The system component in the operational state uses power. De-configuring the system component changes the system component from the operational state to the non-operational state. In a further embodiment, the system component in the non-operational state uses substantially no power. In another embodiment, the system component includes a processor, a processor core, a cache memory, a memory module, an input/output component, a storage device, or a system bus.

In one embodiment, the system component is connected to another system component. In another embodiment, the one or more system components receive power from the one or more power supplies via one or more power buses. In another embodiment, the computer system is operational to process data during the system power test. In another embodiment, the computer system is in a final state during the system power test. The final state includes a state ready for an end user of the computer system to process data.

In one embodiment, the configure module configures and the de-configure module de-configures a plurality of system components during the system power test such that system power usage changes within a full operational load range of the one or more power supplies. In another embodiment, the diagnostic module measures voltage, current, and/or power at one or more points in the power system. In another embodiment, the diagnostic module measures steady-state and/or transient conditions for voltage, current, and/or power in the power system. In another embodiment, the configure module and the de-configure module configure and de-configure system components using a communication bus within the computer system.

A method for power system testing includes initiating a system power test for a computer system. The computer system includes one or more power supplies that provide power to a plurality of system components. The system power test includes determining power system characteristics under various loading conditions. The method includes configuring a system component of the plurality of system components during the system power test. The system component uses a higher amount of power after being configured than in a previous un-configured condition. The method includes de-configuring the system component during the system power test. The system component uses a lower amount of power after being de-configured than in a previous configured condition. The method includes measuring power system performance of the computer system during varying loading conditions caused by configuring and de-configuring one or more system components.

In one embodiment, configuring the system component and de-configuring the system component include using one or more system firmware commands while the computer system is operational. In another embodiment, configuring the system component changes the system component from a non-operational state to an operational state. The system component in the operational state uses power. De-configuring the system component changes the system component from the operational state to the non-operational state. In another embodiment, the computer system is operational to process data during the system power test. In another embodiment, the computer system is in a final state during the system power test. The final state includes a state ready for an end user of the computer system to process data.

A computer system for power system testing includes a power supply, a plurality system components configured to process data, and a power bus that provides power from the power supply to the plurality of system components. The computer system includes a system test module that initiates a system power test for the computer system. The computer system power test includes determining power system characteristics under various loading conditions. The computer system includes a configure module that configures a system component of the plurality of system components during the system power test. The system component uses a higher amount of power after being configured than in a previous un-configured condition. The computer system includes a de-configure module that de-configures the system component during the system power test. The system component uses a lower amount of power after being de-configured than in a previous configured condition. The computer system includes a diagnostic module that measures power system performance of the computer system during varying loading conditions caused by configuring and de-configuring one or more system components by the configure module and the de-configure module. In one embodiment, the system includes an input device and an electronic display both connected to the computer system.

BRIEF DESCRIPTION OF THE DRAWINGS

In order that the advantages of the embodiments of the invention will be readily understood, a more particular description of the embodiments briefly described above will be rendered by reference to specific embodiments that are illustrated in the appended drawings. Understanding that these drawings depict only some embodiments and are not therefore to be considered to be limiting of scope, the embodiments will be described and explained with additional specificity and detail through the use of the accompanying drawings, in which.

DETAILED DESCRIPTION

Reference throughout this specification to "one embodiment," "an embodiment," or similar language means that a particular feature, structure, or characteristic described in connection with the embodiment is included in at least one embodiment. Thus, appearances of the phrases "in one embodiment," "in an embodiment," and similar language throughout this specification may, but do not necessarily, all refer to the same embodiment, but mean "one or more but not all embodiments" unless expressly specified otherwise. The terms "including," "comprising," "having," and variations thereof mean "including but not limited to" unless expressly specified otherwise. An enumerated listing of items does not imply that any or all of the items are mutually exclusive and/or mutually inclusive, unless expressly specified otherwise. The terms "a," "an," and "the" also refer to "one or more" unless expressly specified otherwise.

Furthermore, the described features, advantages, and characteristics of the embodiments may be combined in any suitable manner. One skilled in the relevant art will recognize that the embodiments may be practiced without one or more of the specific features or advantages of a particular embodiment. In other instances, additional features and advantages may be recognized in certain embodiments that may not be present in all embodiments.

These features and advantages of the embodiments will become more fully apparent from the following description and appended claims, or may be learned by the practice of embodiments as set forth hereinafter. As will be appreciated by one skilled in the art, aspects of the present invention may be embodied as a system, method, and/or computer program product. Accordingly, aspects of the present invention may take the form of an entirely hardware embodiment, an entirely software embodiment (including firmware, resident software, micro-code, etc.) or an embodiment combining software and hardware aspects that may all generally be referred to herein as a "circuit," "module," or "system." Furthermore, aspects of the present invention may take the form of a computer program product embodied in one or more computer readable medium(s) having program code embodied thereon.

Many of the functional units described in this specification have been labeled as modules, in order to more particularly emphasize their implementation independence. For example, a module may be implemented as a hardware circuit comprising custom VLSI circuits or gate arrays, off-the-shelf semiconductors such as logic chips, transistors, or other discrete components. A module may also be implemented in programmable hardware devices such as field programmable gate arrays, programmable array logic, programmable logic devices or the like.

Modules may also be implemented in software for execution by various types of processors. An identified module of program code may, for instance, comprise one or more physical or logical blocks of computer instructions which may, for instance, be organized as an object, procedure, or function. Nevertheless, the executables of an identified module need not be physically located together, but may comprise disparate instructions stored in different locations which, when joined logically together, comprise the module and achieve the stated purpose for the module.

Indeed, a module of program code may be a single instruction, or many instructions, and may even be distributed over several different code segments, among different programs, and across several memory devices. Similarly, operational data may be identified and illustrated herein within modules, and may be embodied in any suitable form and organized within any suitable type of data structure. The operational data may be collected as a single data set, or may be distributed over different locations including over different storage devices, and may exist, at least partially, merely as electronic signals on a system or network. Where a module or portions of a module are implemented in software, the program code may be stored and/or propagated on in one or more computer readable medium(s).

The computer readable medium may be a tangible computer readable storage medium storing the program code. The computer readable storage medium may be, for example, but not limited to, an electronic, magnetic, optical, electromagnetic, infrared, holographic, micromechanical, or semiconductor system, apparatus, or device, or any suitable combination of the foregoing.

More specific examples of the computer readable storage medium may include but are not limited to a portable computer diskette, a hard disk, a random access memory (RAM), a read-only memory (ROM), an erasable programmable read-only memory (EPROM or Flash memory), a portable compact disc read-only memory (CD-ROM), a digital versatile disc (DVD), an optical storage device, a magnetic storage device, a holographic storage medium, a micromechanical storage device, or any suitable combination of the foregoing. In the context of this document, a computer readable storage medium may be any tangible medium that can contain, and/or store program code for use by and/or in connection with an instruction execution system, apparatus, or device.

The computer readable medium may also be a computer readable signal medium. A computer readable signal medium may include a propagated data signal with program code embodied therein, for example, in baseband or as part of a carrier wave. Such a propagated signal may take any of a variety of forms, including, but not limited to, electrical, electro-magnetic, magnetic, optical, or any suitable combination thereof. A computer readable signal medium may be any computer readable medium that is not a computer readable storage medium and that can communicate, propagate, or transport program code for use by or in connection with an instruction execution system, apparatus, or device. Program code embodied on a computer readable signal medium may be transmitted using any appropriate medium, including but not limited to wire-line, optical fiber, Radio Frequency (RF), or the like, or any suitable combination of the foregoing In one embodiment, the computer readable medium may comprise a combination of one or more computer readable storage mediums and one or more computer readable signal mediums. For example, program code may be both propagated as an electro-magnetic signal through a fiber optic cable for execution by a processor and stored on RAM storage device for execution by the processor.

Program code for carrying out operations for aspects of the present invention may be written in any combination of one or more programming languages, including an object oriented programming language such as Java, Smalltalk, C++, PHP or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

The computer program product may be shared, simultaneously serving multiple customers in a flexible, automated fashion. The computer program product may be standardized, requiring little customization and scalable, providing capacity on demand in a pay-as-you-go model.

The computer program product may be stored on a shared file system accessible from one or more servers. The computer program product may be executed via transactions that contain data and server processing requests that use Central Processor Unit (CPU) units on the accessed server. CPU units may be units of time such as minutes, seconds, hours on the central processor of the server. Additionally the accessed server may make requests of other servers that require CPU units. CPU units are an example that represents but one measurement of use. Other measurements of use include but are not limited to network bandwidth, memory usage, storage usage, packet transfers, complete transactions etc.

The computer program product may be integrated into a client, server and network environment by providing for the computer program product to coexist with applications, operating systems and network operating systems software and then installing the computer program product on the clients and servers in the environment where the computer program product will function.

Furthermore, the described features, structures, or characteristics of the embodiments may be combined in any suitable manner. In the following description, numerous specific details are provided, such as examples of programming, software modules, user selections, network transactions, database queries, database structures, hardware modules, hardware circuits, hardware chips, etc., to provide a thorough understanding of embodiments. One skilled in the relevant art will recognize, however, that embodiments may be practiced without one or more of the specific details, or with other methods, components, materials, and so forth. In other instances, well-known structures, materials, or operations are not shown or described in detail to avoid obscuring aspects of an embodiment.

Aspects of the embodiments are described below with reference to schematic flowchart diagrams and/or schematic block diagrams of methods, apparatuses, systems, and computer program products according to embodiments of the invention. It will be understood that each block of the schematic flowchart diagrams and/or schematic block diagrams, and combinations of blocks in the schematic flowchart diagrams and/or schematic block diagrams, can be implemented by program code. The program code may be provided to a processor of a general purpose computer, special purpose computer, sequencer, or other programmable data processing apparatus to produce a machine, such that the instructions, which execute via the processor of the computer or other programmable data processing apparatus, create means for implementing the functions/acts specified in the schematic flowchart diagrams and/or schematic block diagrams block or blocks.

The program code may also be stored in a computer readable medium that can direct a computer, other programmable data processing apparatus, or other devices to function in a particular manner, such that the instructions stored in the computer readable medium produce an article of manufacture including instructions which implement the function/act specified in the schematic flowchart diagrams and/or schematic block diagrams block or blocks.

The program code may also be loaded onto a computer, other programmable data processing apparatus, or other devices to cause a series of operational steps to be performed on the computer, other programmable apparatus or other devices to produce a computer implemented process such that the program code which executed on the computer or other programmable apparatus provide processes for implementing the functions/acts specified in the flowchart and/or block diagram block or blocks.

The schematic flowchart diagrams and/or schematic block diagrams in the Figures illustrate the architecture, functionality, and operation of possible implementations of apparatuses, systems, methods and computer program products according to various embodiments of the present invention. In this regard, each block in the schematic flowchart diagrams and/or schematic block diagrams may represent a module, segment, or portion of code, which comprises one or more executable instructions of the program code for implementing the specified logical function(s).

It should also be noted that, in some alternative implementations, the functions noted in the block may occur out of the order noted in the Figures. For example, two blocks shown in succession may, in fact, be executed substantially concurrently, or the blocks may sometimes be executed in the reverse order, depending upon the functionality involved. Other steps and methods may be conceived that are equivalent in function, logic, or effect to one or more blocks, or portions thereof, of the illustrated Figures.

Although various arrow types and line types may be employed in the flowchart and/or block diagrams, they are understood not to limit the scope of the corresponding embodiments. Indeed, some arrows or other connectors may be used to indicate only the logical flow of the depicted embodiment. For instance, an arrow may indicate a waiting or monitoring period of unspecified duration between enumerated steps of the depicted embodiment. It will also be noted that each block of the block diagrams and/or flowchart diagrams, and combinations of blocks in the block diagrams and/or flowchart diagrams, can be implemented by special purpose hardware-based systems that perform the specified functions or acts, or combinations of special purpose hardware and program code.

Figure 1:
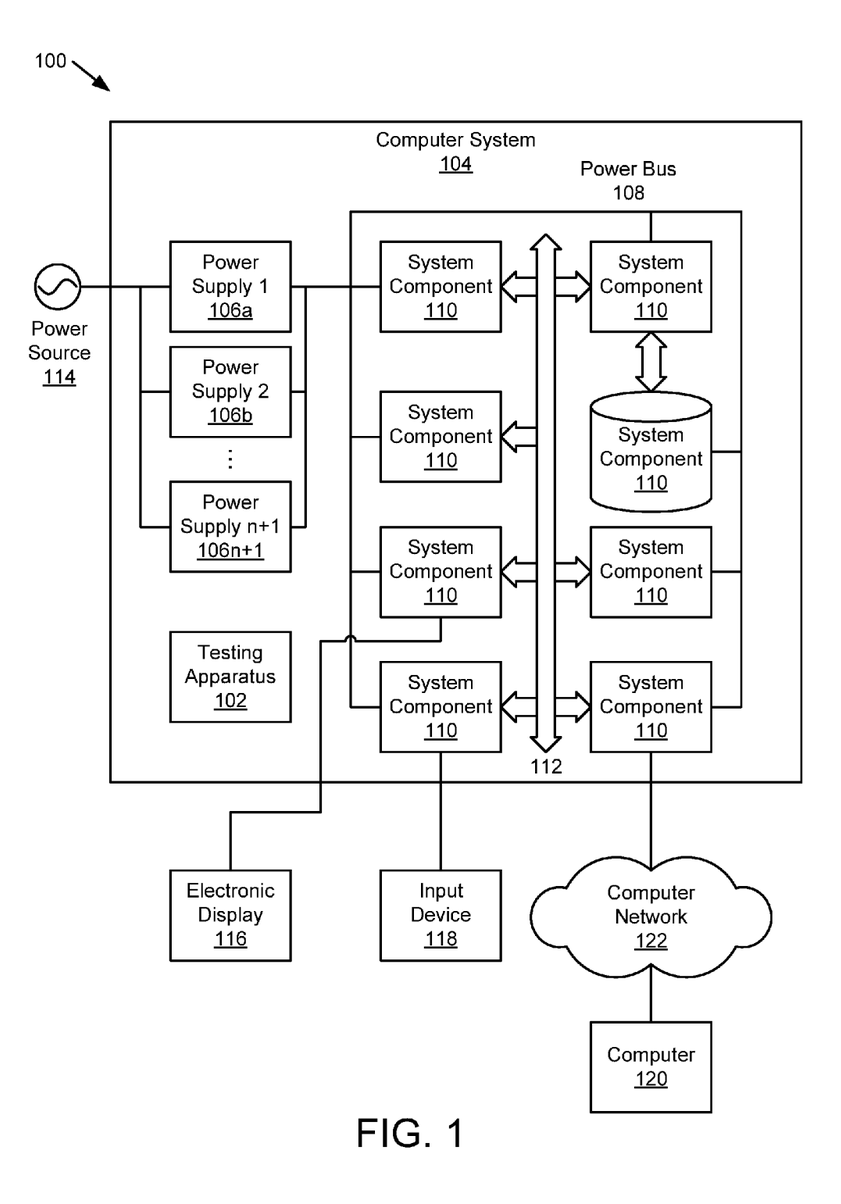
FIG. 1 is a schematic block diagram illustrating one embodiment of a system for varying load in a system power test in accordance with one embodiment of the present invention.

FIG. 1 is a schematic block diagram illustrating one embodiment of a system 100 for varying load in a system power test in accordance with one embodiment of the present invention. The system 100 includes a testing apparatus 102 in a computer system 104 where the computer system includes multiple power supplies (power supply 1 106a, power supply 2 106b, and power supply n+1 106n+1, collectively "power supply 106"), a power bus 108, system components 110 (individually or collectively), and a computer bus 112, a power source 114, an electronic display 116, an input device 118, and a computer 120 connected to the computer system 104 through a computer network 122, which are described below.

In one embodiment, the system 100 includes a testing apparatus 102 that varies a load for the computer system 104 during a system power test. In another embodiment, the testing apparatus 102 may be located in or accessible to a computer 120 connected to the computer system 104, for example, through a computer network 122 or through another communication method, such as a direct connection to the computer system 104. In another embodiment, a portion of the testing apparatus 102 is in or accessible to the computer system 104 and a remainder of the testing apparatus 102 is located elsewhere. The testing apparatus 102 will be discussed in more detail with regard to the apparatus 200 of FIG. 2.

The system 100 includes a computer system 104 that includes one or more power supplies 106 that provide power to a plurality of system components 110 through a power bus 108. In one embodiment, the computer system 104 includes a single power supply (e.g. power supply 1 106a). In another embodiment, the computer system 104 includes multiple power supplies (e.g. power supplies 1-n 106a-106n+1) that are sized for an expected power load of the system components 110 of the computer system 104 or that are sized for redundancy. For example, the computer system 104 may include n+1 power supplies 106 such that "n" power supplies 106a-n provide a rated amount of power to the computer system 104 while a redundant power supply 106n+1 provides extra capacity in case one of the power supplies 106a-n fails. One of skill in the art will recognize other power supply 106 configurations for a computer system 104.

The power supplies 106 connect to one or more power buses 108 in the computer system 104. For example, the power supplies 106 may connect to various power buses 108 each with a different voltage, such as 12 volts ("V"), 5 V, 2.5 V, etc. Each power supply (e.g. power supply 1 106a) may have multiple outputs each at a different voltage. In another embodiment, the computer system 104 may include redundant power buses 108 and some of the power supplies 106 may connect to one power bus 108 while other power supplies connect to another power bus 108. One of skill in the art will recognize various power supply topologies, power supply configurations, and power bus configurations within a computer system 104.

Typically a power supply (e.g. power supply 1 106a) includes a feedback loop that senses when a voltage or current is different than a setpoint and adjusts to bring the voltage or current back to the setpoint. When multiple power supplies 106 are linked to a particular power bus 108, the power supplies 106 may include a feedback loop that controls the power supplies 106, for example to share current as intended and to work to ensure that the power supplies 106 operate together without instability or other issues. The power supplies 106 may include a master and other slave power supplies 106. The power supplies 106 may include a voltage feedback loop to regulate voltage on the power bus 108 along with other current sharing loops or other regulation loops.

The power supplies 106 may be direct current ("DC") to DC, alternating current ("AC") to DC, DC to AC, AC to AC or other type of power supply configuration. In one embodiment, one or more power supplies 106 are switching power converters. In other embodiments, the power supplies 106 include transformers, voltage regulators, etc. The power supplies 106 may include one or more power stages. For example, a power supply 106 may include an inverter section, a power conditioning section, and a regulation section. The inverter section may rectify an AC voltage. The power conditioning section may include filtering or may include active components, such as for active power factor correction. The regulation section may provide power to the power bus 108.

The computer system 104 includes a plurality of system components 110. The system components 110 are any component that connect directly or indirectly to the power bus 108 and that consume power or cause power to be consumed. For example, system components 110 may include a processor, such as a central processing unit ("CPU"), a core of a multi-core processor, cache memory, a memory module, read-only memory ("ROM"), random access memory ("RAM"), a chipset, a data storage device, a graphics processing unit ("GPU"), a universal serial bus ("USB") interface, an input/output interfaces, and any other component common to a computer system 104 and known to those of skill in the art. The computer system 104 may also include one or more computer buses 112 used for communication of data between system components 110, such as a peripheral component interconnect ("PCI") express bus, a serial ATA ("SATA") bus, a USB, etc. One of skill in the art will recognize other computer buses 112 common to a computer system 104. A computer bus 112 may use power from a power supply 106.

In one embodiment, one or more system components 110 may be configured and/or de-configured. For example, a system component 110 may be in an un-configured state and may be configured for operation. A system component 110 that is configured may use more power than the system component 110 when un-configured. For example, the system component 110 may use substantially no power when un-configured. Substantially no power, as used herein, includes a state of the system component 110 of using no power as well as a state of using a small amount of power in comparison with the system component 110 that is configured and operational where substantially more power is used by the system component 110. In one embodiment, the system component 110 is installed in the computer system 104 and configuration or de-configuration occurs while the computer system 104 is operational, for example using a computer bus 112.

The system 100, in one embodiment, includes a power source 114 that provides power to the one or more power supplies 106. In another embodiment, two or more power sources 114 provide power to the power supplies 106. The power source 114 may be AC or DC. The power source 114 may be from a utility, from batteries, from an alternative power source such as solar power, or other power type or source known to those of skill in the art. In one embodiment, the power source 114 is a power supply from another computer system or device. One of skill in the art will recognize other ways to provide power to the power supplies 106.

The system 100, in another embodiment, includes one or more electronic displays 116 that connect to the computer system 104, such as a monitor, a display screen, etc. The electronic displays 116 may be separate from the computer system 104 or may be integral with the computer system 104. The system 100 may also include one or more input devices 118, such as a keyboard, a mouse, a touch screen, a communication bus, or other device capable of receiving input by a user or computer and sending the input to the computer system 104. The system 100 may also include a computer 120 connected to the computer system 104 via a computer network 122. The compute 120 may be set up as a client, or may be a test initiating computer that interfaces with the computer system 104 via the computer network 122. The computer network 122 may include a local area network ("LAN"), the Internet, a wireless network, etc., or a combination of computer networks and may include cabling, routers, switches, servers, etc. known to those of skill in the art.

The computer system 104 may be a mainframe computer, a system with components in one or more racks, may be a laptop computer, a tablet computer, a personal computer, a server, a workstation, etc. The computer system 104 may be a router, a switch, a dedicated system that is part of an appliance or other device, or any other system with one or more power supplies 106 feeding a plurality of system components 110. The computer system 104 may be together in an enclosure or may be distributed in multiple enclosures, racks, etc. The computer system 104 may include any system where system components 110 may be configured and de-configured to change an amount of power that a system component 110 is using.

Figure 2:
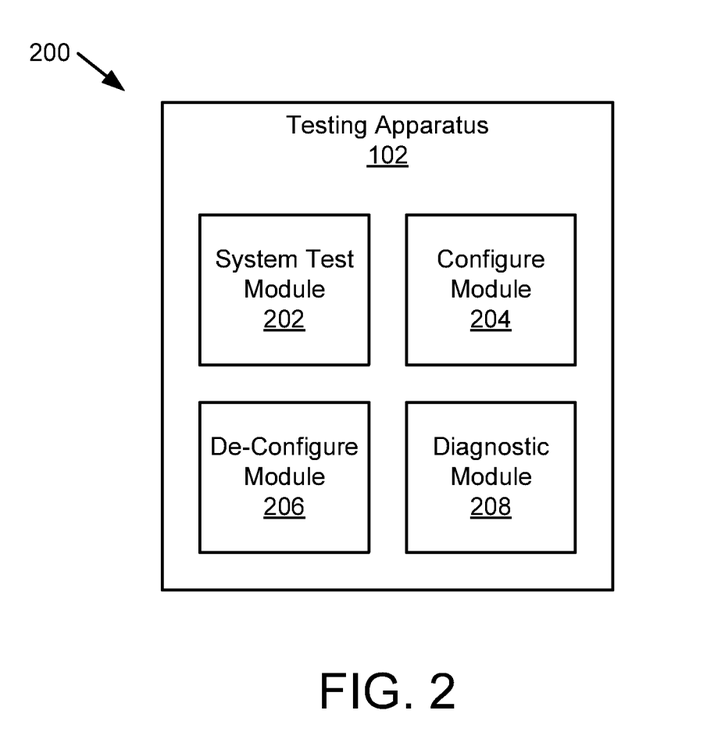
FIG. 2 is a schematic block diagram illustrating one embodiment of an apparatus for varying load in a system power test in accordance with one embodiment of the present invention.

FIG. 2 is a schematic block diagram illustrating one embodiment of an apparatus 200 for varying load in a system power test in accordance with one embodiment of the present invention. The apparatus 200 includes one embodiment of the testing apparatus 102 with a system test module 202, a configure module 204, a de-configure module 206, and a diagnostic module 208, which are described below. The modules 202-208 of the apparatus 200 may be located together or a portion of one or more modules 202-208 may be separated. For example, all or a portion of the modules 202-208 may be external to the computer system 104 while a portion of the modules 202-208 may be included in the computer system 104. In one embodiment, the apparatus 200 is included in a computer (such as the computer 120 connected to through the computer network 122 a computer that is an input device 118) and is independent of the computer system 104 but is capable of interfacing with the computer system 104.

In one embodiment, the apparatus 200 includes a system test module 202 that initiates a system power test for the computer system 104. The system power test includes determining power system characteristics under various loading conditions. Typically the system power test is useful in determining if the power supplies 106 are operating properly and/or within specification limits. The loading conditions are various loads to that consume power from the power supplies 106. For example, loading on the power bus 108 may range within a full operational load range for the one or more power supplies 106 of the computer system 104. In one embodiment, the system test module 202 initiates the system power test while the computer system 104 is operational. In another embodiment, the system test module 202 initiates the system power test while the computer system 104 is in a final assembly state suitable for shipment to a consumer or while being used by a consumer.

The system test module 202, in another embodiment, initiates the system power test using one or more interfaces to the computer system 104, such as a computer network 122, an external interface, a computer bus 112, etc. while power supplies 106 in the computer system 104 are operational and providing power to the system components 110. In another embodiment, at least some system components 110 are operational at least to some degree. In one embodiment, the system test module 202 and other modules 204-208 of the testing apparatus 102 communicate with the computer system 104 using low-level commands, such as system firmware commands or basic input/output system ("BIOS") commands. In other embodiments, the modules 202-208 communicate with the computer system 104 using higher level commands.

The apparatus 200, in one embodiment, includes a configure module 204 that configures a system component 110 during the system power test. The system component 110 uses a higher amount of power after being configured than in a previous un-configured condition. In another embodiment, the apparatus 200 includes a de-configure module 206 that de-configures the system component 110 during the system power test. The system component 110 uses a lower amount of power after being de-configured than in a previous configured condition. Typically the configure module 204 configures the system component 110 and the de-configure module 206 de-configures the system component 110 using one or more system firmware commands while the computer system 104 is operational. Beneficially, the configure module 204 and de-configure module 206 allow changes in power system loading during the system power test while the computer system 104 is operating and processing data without having to physically alter the computer system 104. For example, the computer system 104 may be in a final state during the system power test where the final state may be a state ready for an end user of the computer system 104 to process data.

In one embodiment, configuring the system component 110 changes the system component 110 from a non-operational state to an operational state where the system component 110 in the operational state uses power. For example, if a system component 110 is a core of a CPU, the de-configure module 206 may de-configure the core to fence off the core so the core is not processing data. In this fenced off or de-configured state, the core may use less power than when configured. In addition, other components controlled by the core of the CPU may use less power or may also be de-configured by the de-configure module. In another embodiment, a hard disk drive may be a system component 110 that is configured or de-configured by the configure module 204 and de-configure module 206. De-configuring the system component 110, in one example, changes the system component 110 from the operational state to the non-operational state. In the non-operational state, in one example, the system component 110 uses substantially no power.

Many components in a typical computer system have varying amounts of activity while in operation. However, many system components 110 use about the same amount of power when accessed as when the system component 110 is idle. For example, typical system tests in a computer system exercise various system components 110. However, the system tests may not provide enough load variation to satisfy system power testing requirements.

By configuring and de-configuring the system component 110, power usage of the system component 110 may change more than when the system component 110 is accessed and then not accessed. Accessing a system component 110, as used herein, includes sending commands, data, running data tests, etc. where the system component 110 is actively processing data or performing a function normally done when the system component 110 is configured and in use. In a configured state, the system component 110 may be ready for use by the computer system 104 while in a de-configured state the system component 110 may be unavailable for use, and for example, may be in a state ready for removal from the computer system 104.

The configure module 204 and de-configure module 206 may allow system power testing without physically inserting a switch or other device to power and remove power from a system component 110 to change loads, and allow the system components 110 in the computer system 104 to be used to vary load instead of using resistors or other simulated load conditions. Beneficially, the apparatus 200 provides a way to conduct a system power test in a final configuration so that problems with the power system of the computer system 104 may be detected where the same problems may not be present with typical resistive load testing or other simulated loading situations. For example, capacitance and inductance of the computer system 104 in a final state may differ from simulated loading conditions and power system stability problems may be present in the final assembled state of the computer system 104 that may not be present with other loading configurations. The configure module 204 and the de-configure module 206 may communicate configure and de-configure commands using a computer bus 112 such as a communications bus within the computer system 104.

In one embodiment, the configure module 204 and the de-configure module 206 configure and de-configure enough system components 110 to fully test the power supplies 106 and overall power system during the system power test such that system power usage changes within a full operational load range of the one or more power supplies 106. The configure module 204 and the de-configure module 206 may also configure and de-configure system components 110 in a particular order to test various parts of the computer system 104, impose various loading conditions, run specific tests, etc. during the system power test. The configure module 204 and the de-configure module 206 may offer flexibility in system power testing previously unavailable for computer systems 104.

In one embodiment, the apparatus includes a diagnostic module 208 that measures power system performance of the computer system 104 during varying loading conditions caused by configuring and de-configuring one or more system components 110 by the configure module 204 and the de-configure module 206. For example, the diagnostic module 208 may measure voltages, currents, power, etc. at various locations in the computer system 104, which may help indicate performance characteristics of the power system of the computer system 104 during the system power test. In one embodiment, the diagnostic module 208 may measure steady-state conditions of the power system of the computer system 104. In another embodiment, the diagnostic module 208 measures transient conditions in the power system of the computer system 104. The diagnostic module 208 may also make other measurements, such as bode plots, stability analysis, etc.

Figure 3:
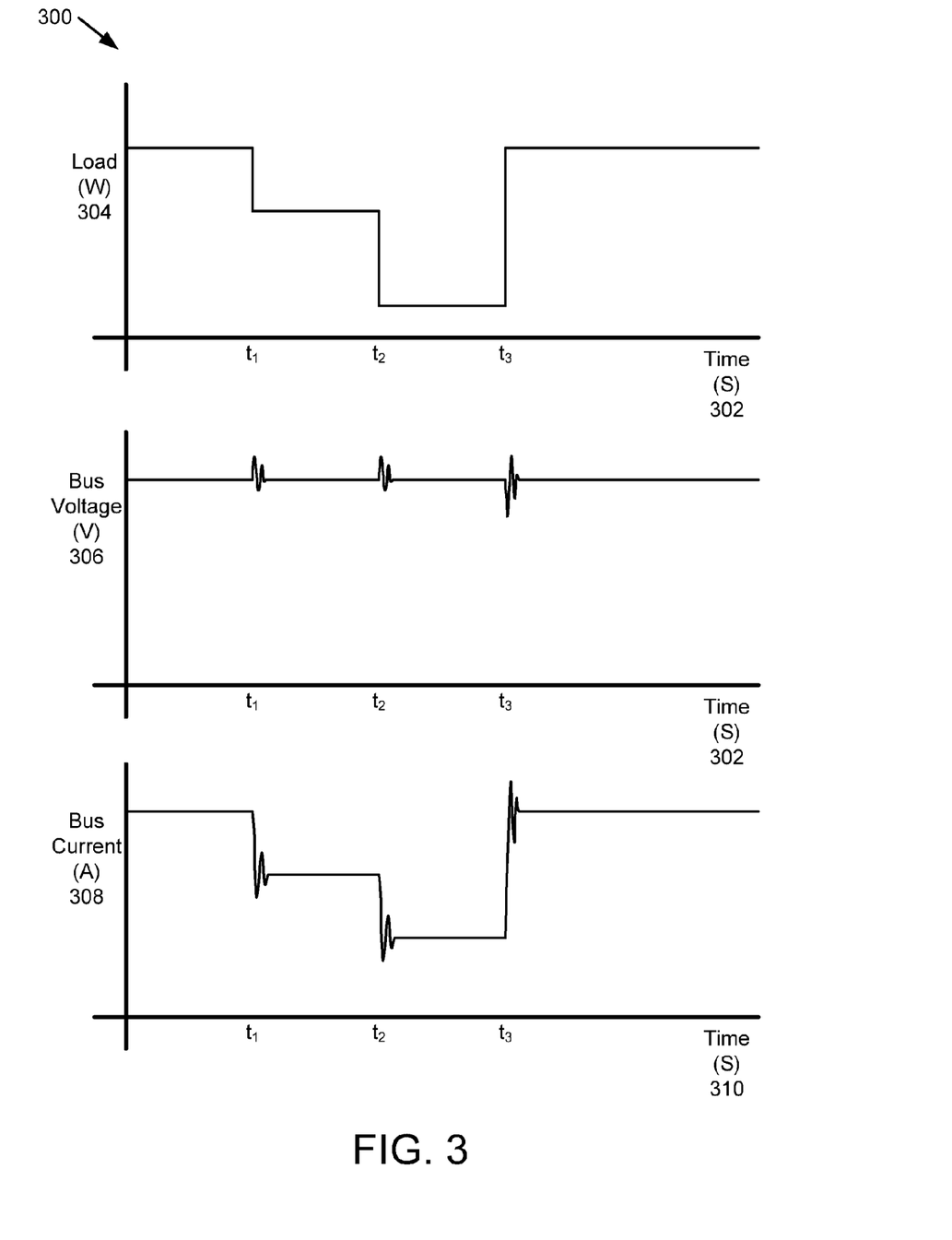
FIG. 3 is a set of possible waveforms representing typical voltage and current waveforms when a system load is changed in accordance with one embodiment of the present invention.

FIG. 3 is a set of possible waveforms 300 representing typical voltage and current waveforms when a system load is changed in accordance with one embodiment of the present invention. The set of possible waveforms 300 indicates conditions that may occur in the computer system 104 during a system power test. The top waveform is a plot of load 304, which may be expressed in watts ("W"), versus time 302, which may be expressed in seconds ("S"). The time 302 axis may be seconds, milliseconds, microseconds, etc. The middle waveform shows a bus voltage 306, which may be expressed in volts ("V") versus time 302 and the bottom waveform shows a bus current 308, which may be expressed in amperes ("A"). The bus voltage 306 and bus current 308 may be at any appropriate location within the power system of the computer system 104. The load waveform shows a load that decreases at time $t_1$, decreases more at time $t_2$, and increases to an original value at time $t_3$.

The bus voltage 306 response and bus current response 308 indicate a fluctuation in both voltage and current when the load changes, indicating a transient condition. The transient condition reveals a voltage and current response that may be considered under-damped. The diagnostic module 208 may measure waveforms such as the set of waveforms 300 of FIG. 3 along with other conditions to analyze system response to load changes. In this particular scenario, an under-damped response may indicate an unacceptable or a borderline unacceptable condition in the final assembled state of the power system of the computer system 104 that may have not been manifest using other testing methods. The diagnostic module 208 may be used in conjunction with the configure module 204 and de-configure module 206 to exercise the power system of the computer system 104 during system power testing to find system stability, power system efficiency, power system response, system impedance, and a host of other system power tests while the computer system 104 is operational.

Figure 4:
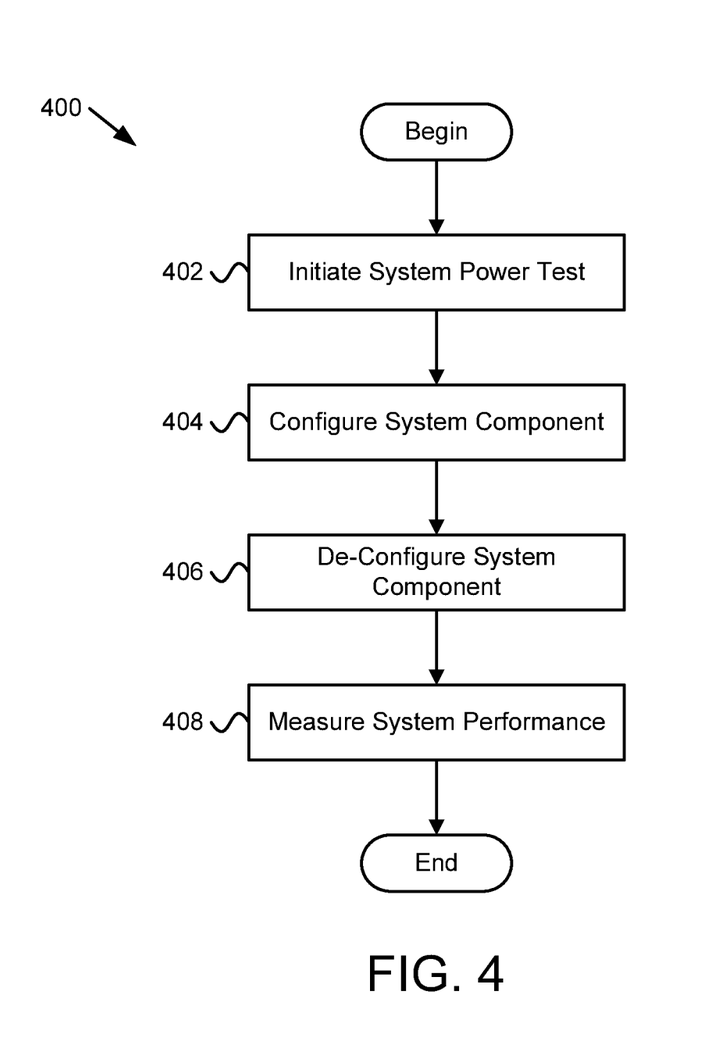
FIG. 4 is a schematic flow chart diagram illustrating one embodiment of a method for varying load in a system power test in accordance with one embodiment of the present invention.

FIG. 4 is a schematic flow chart diagram illustrating one embodiment of a method 400 for varying load in a system power test in accordance with one embodiment of the present invention. The method 400 begins and initiates 402 a system power test. The system power test is for a computer system 104 where one or more power supplies 106 provide power to system components 110 that receive power from the power supplies 106 via one or more power buses 108. The system power test includes determining power system characteristics under various loading conditions. The system components 110 provide loading for the power system of the computer system 104. In one embodiment, the system test module 202 initiates 402 the system power test.

The method 400 configures 404 and de-configures 406 one or more system components 110 during the system power test. When the method 400 configures 404 a system component 110, the system component 110 uses a higher amount of power after being configured 404 than in a previous un-configured condition. Likewise, when the method 400 de-configures 406 the system component 110, the system component 110 uses a lower amount of power after being de-configured 406 than in a previous configured condition. The configure module 204 and the de-configured module 206, in various embodiments, may be used to configure 404 and de-configure 406 the system components 110.

The method 400 measures 408 power system performance of the computer system 104 during varying loading conditions caused by configuring 404 and de-configuring the system components 110, and the method 400 ends. In one embodiment, the diagnostic module 208 measures 408 power system performance. The method 400 may measure current, voltage, power, etc. at various points of the power system of the computer system 104 to measure power system performance. The method 400 may measure 408 transient performance, steady-state performance, etc.

Figure 5:
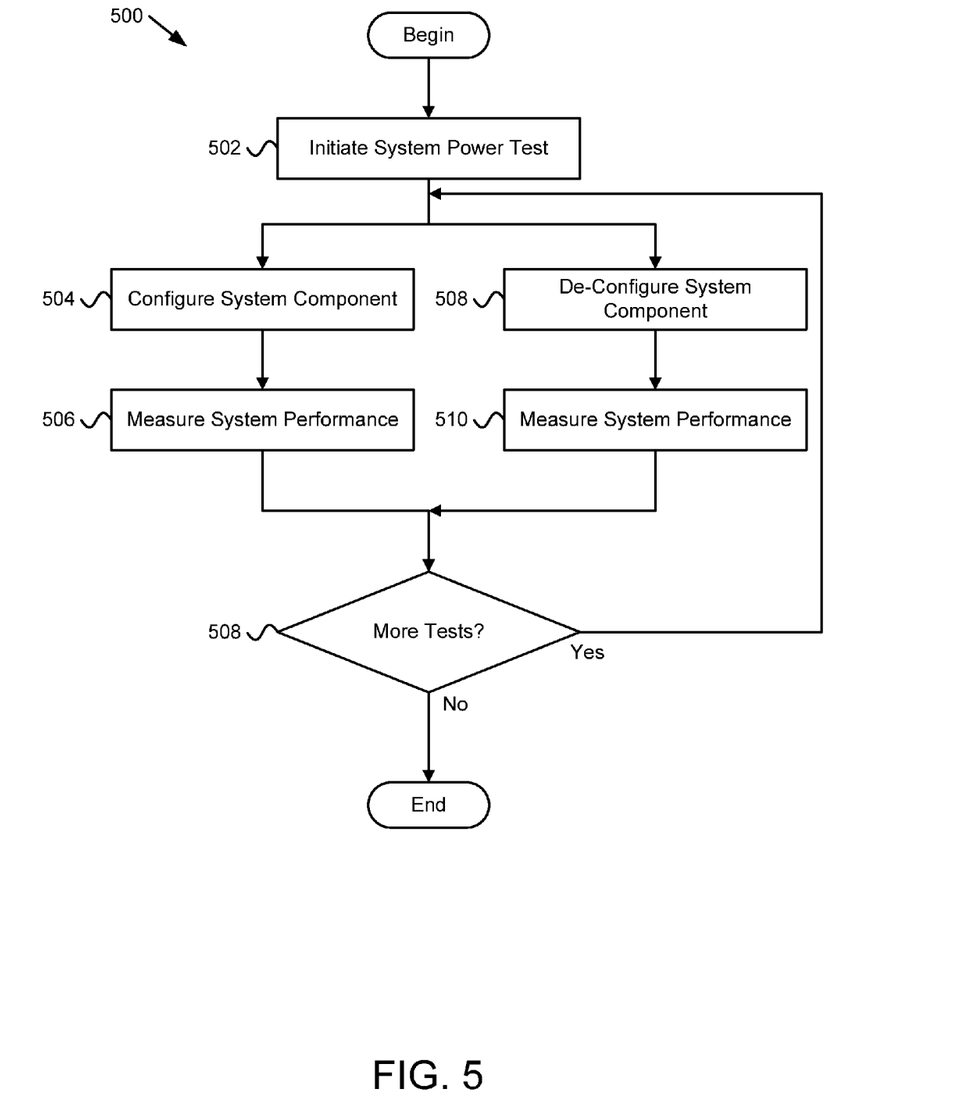
FIG. 5 is a schematic flow chart diagram illustrating another embodiment of a method for varying load in a system power test in accordance with one embodiment of the present invention.

FIG. 5 is a schematic flow chart diagram illustrating another embodiment of a method 500 for varying load in a system power test in accordance with one embodiment of the present invention. The method 500 begins and initiates 502 a system power test. The method 500 configures 504 one or more system components 110 and then measures 506 power system performance after configuring 504 the one or more system components 110. The method 500 may also de-configure 508 one or more system components 110 and then measures 510 system performance after de-configuring 508 the one or more system components 110. The method 500 determines 512 if there are more tests to perform. If the method 500 determines 512 that there are more tests to perform, the method 500 returns and configures 504 or de-configures 508 system components 110, or both. If the method 500 determines 512 that there are no more tests to perform, the method 500 ends. One of skill in the art will recognize numerous combinations of configuring 504 and de-configuring 508 one or more system components 110 to adequately test the power system of the computer system 104 in the system power test.

The embodiments may be practiced in other specific forms. The described embodiments are to be considered in all respects only as illustrative and not restrictive. The scope of the invention is, therefore, indicated by the appended claims rather than by the foregoing description. All changes which come within the meaning and range of equivalency of the claims are to be embraced within their scope.

What is claimed is:

1. An apparatus comprising:
    a system test module that initiates a system power test for a computer system, the computer system comprising one or more power supplies providing power to a plurality of system components, the system power test comprising determining power system characteristics under various loading conditions;
    a configure module that configures a system component of the plurality of system components during the system power test, the system component using a higher amount of power after being configured than in a previous un-configured condition,
    wherein the system component includes one of a processor, a core of a multi-core processor, a cache memory, a memory module, a read-only memory, a random access memory, a chipset, a data storage device, a graphics processing unit, a universal serial bus interface, or an input/output interface;
    a de-configure module that de-configures the system component during the system power test, the system component using a lower amount of power after being de-configured than in a previous configured condition; and
    a diagnostic module that measures power system performance of the computer system during varying loading conditions caused by configuring and de-configuring one or more system components by the configure module and the de-configure module.

2. The apparatus of claim 1, wherein the configure module configures the system component and the de-configure module de-configures the system component using one or more system firmware commands while the computer system is operational.

3. The apparatus of claim 1, wherein configuring the system component changes the system component from a non-operational state to an operational state, the system component in the operational state using power and wherein de-configuring the system component changes the system component from the operational state to the non-operational state.

4. The apparatus of claim 3, wherein the system component in the non-operational state uses substantially no power.

5. The apparatus of claim 1, wherein the system component comprises one of a processor, a processor core, a cache memory, a memory module, an input/output component, a storage device, and a system bus.

6. The apparatus of claim 1, wherein the system component is connected to another system component.

7. The apparatus of claim 1, wherein the one or more system components receive power from the one or more power supplies via one or more power buses.

8. The apparatus of claim 1, wherein the computer system is operational to process data during the system power test.

9. The apparatus of claim 1, wherein the computer system is in a final state during the system power test, the final state comprising a state ready for an end user of the computer system to process data.

10. The apparatus of claim 1, wherein the configure module configures and the de-configure module de-configures a plurality of system components during the system power test such that system power usage changes within a full operational load range of the one or more power supplies.

11. The apparatus of claim 1, wherein the diagnostic module measures one or more of voltage, current, and power at one or more points in the power system.

12. The apparatus of claim 11, wherein the diagnostic module measures one or more of steady-state and transient conditions for one or more of voltage, current, and power in the power system.

13. The apparatus of claim 1, wherein the configure module and the de-configure module configure and de-configure system components using a communication bus within the computer system.

14. A method comprising:
   initiating a system power test for a computer system, the computer system comprising one or more power supplies providing power to a plurality of system components, the system power test comprising determining power system characteristics under various loading conditions;
   configuring a system component of the plurality of system components during the system power test, the system component using a higher amount of power after being configured than in a previous un-configured condition,
   wherein the system component includes one of a processor, a core of a multi-core processor, a cache memory, a memory module, a read-only memory, a random access memory, a chipset, a data storage device, a graphics processing unit, a universal serial bus interface, or an input/output interface;
   de-configuring the system component during the system power test, the system component using a lower amount of power after being de-configured than in a previous configured condition; and
   measuring power system performance of the computer system during varying loading conditions caused by configuring and de-configuring one or more system components.

15. The method of claim 14, wherein configuring the system component and de-configuring the system component comprise using one or more system firmware commands while the computer system is operational.

16. The method of claim 14, wherein configuring the system component changes the system component from a non-operational state to an operational state, the system component in the operational state using power and wherein de-configuring the system component changes the system component from the operational state to the non-operational state.

17. The method of claim 14, wherein the computer system is operational to process data during the system power test.

18. The method of claim 14, wherein the computer system is in a final state during the system power test, the final state comprising a state ready for an end user of the computer system to process data.

19. A computer system comprising:
   a power supply;
   a plurality of system components configured to process data;
   a power bus that provides power from the power supply to the plurality of system components;
   a system test module that initiates a system power test for the computer system, the system power test comprising determining power system characteristics under various loading conditions;
   a configure module that configures a system component of the plurality of system components during the system power test, the system component using a higher amount of power after being configured than in a previous un-configured condition,
   wherein the system component includes one of a processor, a core of a multi-core processor, a cache memory, a memory module, a read-only memory, a random access memory, a chipset, a data storage device, a graphics processing unit, a universal serial bus interface, or an input/output interface;
   a de-configure module that de-configures the system component during the system power test, the system component using a lower amount of power after being de-configured than in a previous configured condition; and
   a diagnostic module that measures power system performance of the computer system during varying loading conditions caused by configuring and de-configuring one or more system components by the configure module and the de-configure module.

20. The system of claim 19, further comprising an input device and an electronic display both connected to the computer system.

* * * * *